United States Patent [19]

Plesski et al.

[11] Patent Number: 5,682,126
[45] Date of Patent: Oct. 28, 1997

[54] LADDER SAW FILTER CONTAINED IN A SINGLE ACOUSTIC TRACK

[75] Inventors: Viktor P. Plesski; Thor Thorvaldsson, both of Bevaix; Serguei N. Kondratiev, Neuchatel, all of Switzerland

[73] Assignee: Advanced Saw Products, Bevaix, Switzerland

[21] Appl. No.: 574,604

[22] Filed: Dec. 18, 1995

[30] Foreign Application Priority Data

Dec. 23, 1994 [GB] United Kingdom ............... 9426466

[51] Int. Cl.$^6$ .................................................. H03H 9/64
[52] U.S. Cl. ..................... 333/193; 310/313 R; 333/195
[58] Field of Search ................................ 333/193–196; 310/313 R, 313 B, 313 C, 313 D

[56] References Cited

U.S. PATENT DOCUMENTS

| | | | |
|---|---|---|---|
| 4,044,321 | 8/1977 | Vasile | 333/72 |
| 4,126,837 | 11/1978 | Koyamada et al. | 333/72 |
| 4,166,258 | 8/1979 | Tseng | 333/195 |
| 4,734,664 | 3/1988 | Hikita et al. | 333/193 |
| 4,785,270 | 11/1988 | Kinsman | 333/193 |
| 4,803,449 | 2/1989 | Hikita et al. | 333/193 |
| 5,115,216 | 5/1992 | Hikita et al. | 333/195 |
| 5,202,652 | 4/1993 | Tabuchi et al. | 333/193 |
| 5,471,178 | 11/1995 | Hickernell | 333/193 |
| 5,499,003 | 3/1996 | Davenport | 333/193 |
| 5,506,532 | 4/1996 | Seki et al. | 333/194 |
| 5,521,453 | 5/1996 | Yatsuda | 333/193 |
| 5,559,481 | 9/1996 | Satoh et al. | 333/193 |

FOREIGN PATENT DOCUMENTS

| | | | |
|---|---|---|---|
| 2121247 | 8/1972 | France . | |
| 5648707 | 5/1981 | Japan | 333/196 |

OTHER PUBLICATIONS

Ultrasonics Symp. Proc. Tseng et al. 1974 whole document.

Primary Examiner—Benny Lee
Assistant Examiner—Darius Gambino
Attorney, Agent, or Firm—Perman & Green, LLP

[57] ABSTRACT

A first interdigitated transducer and a second interdigitated transducer are disposed such that an acoustic port of the first interdigitated transducer confronts an acoustic port of the second interdigitated transducer. A first electric terminal of respective interdigitated transducers are electrically coupled together. The first and second interdigitated transducers have different resonance frequencies and may be acoustically coupled.

20 Claims, 9 Drawing Sheets

$f_{R,par} \equiv f_{R,P}$ in text; $f_{R,ser} \equiv f_{R,s}$ in text; $f_{aR,par} \equiv f_{aR,P}$ in text; and $f_{aR,series} \equiv f_{aR,s}$; in text.

ROUGHLY:

EQUIVALENT CIRCUIT OF EMBODIMENT SHOWN IN FIG.2A.

LADDER SAW FILTER CONTAINED IN A SINGLE ACOUSTIC TRACK

FIELD OF INVENTION

The present invention relates to Surface Acoustic Wave (SAW) filters, in particular to SAW filters for mobile communications.

BACKGROUND TO INVENTION

SAW technology has found a number of applications in the electronics and RF art. Due to the fact that SAW wavelengths are typically $10^5$ times shorter than that of electromagnetic waves having a corresponding frequency, SAW technology has found particular applications where miniaturisation is important or desirable. One such application is the use of SAW filters in radio telephones where the typically small size and weight of SAW filters is highly advantageous over conventional technologies, such as ceramic filters, dielectric filters, and filters using magnetostatic waves. Generally, it is a requirement of such SAW filters that they have low-loss, typically insertion losses of 1~5 dB for RF use, although for IF filters somewhat higher insertion loss of 5~13 dB could be acceptable. Additionally, it is desirable that SAW filters have a good shape factor and high suppression levels in the stopband. Typically the suppression in the stop bands should be better than 30 to 40 dB. A power handling capability of up to 2 Watts is also desirable.

A typical example of a conventional SAW filter is a SAW filter in which SAW energy is transferred between two spaced apart interdigital transducers (IDTs). The IDTs comprise two sets of equally spaced metal strips (electrode fingers), which are formed on the surface of a piezoelectric substrate. The electrode fingers in each set are typically electrically coupled together by bus-bars and are interleaved (interdigitated) with the electrode fingers of the other set. This arrangement can generate SAWs in both directions transverse to each electrode finger when a high frequency electrical signal is applied between the sets of electrode fingers, and it can also generate an electrical voltage when SAWs are incident on the electrode fingers. These processes are most efficient when the frequency of the SAWs is such that the periodicity of the electrode fingers in each set is close to or the same as the SAW wavelength, or some multiple of this frequency. In the simplest form of IDT, the spacing between adjacent electrode fingers of a set of electrode fingers is one SAW wavelength, i.e. one electrode finger per period in each set of electrodes. Thus there are two electrode fingers per period taking into account both sets of electrode fingers. The conventional terms in the art for such arrangements are "two electrodes per period" or "two electrodes per wavelength". However, it is possible to have more than one finger per SAW wavelength (period).

A particular path for a surface acoustic wave comprising SAW elements such as IDTs and/or reflection gratings is known as a track, or acoustic channel.

Known SAW filters which have the aforementioned insertion losses and stop-band suppression are typically one of two types.

The first types are Coupled Resonator Filters (CRFs), shown schematically in FIG. 1A for a two port resonator structure and described in, for example, "SAW devices for consumer communication application", IEEE Trans. on UFFC, Vol.40, No. 5, pages 438–452, 1993. CRFs typically have small size but are unable to operate at high power levels and have relatively narrow passbands. CRFs also have relatively high losses which are determined by the electrode's resistivity, bulk wave generation and other factors.

The electrode resistivity is important because CRFs have a relatively low number of long electrodes in their transducers compared to impedance element type filters where there are a large number of electrodes. Since the electrode resistances are connected in parallel then the less there are the greater the total resistance compared to a device having a large number of electrodes.

The CRF two part resonator structure shown in FIG. 1A comprises two resonators 102 consisting of electrode fingers 104 coupled to respective busbars 108, 110, 112 and 114. Busbars 110 and 112 are grounded. Reflection gratings 106 are disposed at each end of the structure, and between the two transducers 102. The aperture of the transducers is W and the electrode period is p1.

The second are ladder type filters and are described in "SAW integrated modules for 800-MHz cellular radio portable telephones with new frequency allocations", IEEE Trans. on UFFC, Vol. 36, No. 5, pp. 531–539, 1989, "Design methodology and synthesis techniques for ladder-type SAW resonator coupled filters", 1993 IEEE Ultrasonic Symposium, pp. 15–24, "Development of small antenna duplexer using SAW filters for handheld phones", 1992 IEEE Ultrasonics Proc. pp. 111–114, European Patent Application 0 541 284 A1, "Impedance element SAW filters", 1994 IEEE Frequency Control Symposium Proc., pp. 374–378, "Balanced bridge SAW impedance element filters", 1994 IEEE Ultrasonics Proc., to be published, and an article entitled "Miniature SAW Antenna Duplexer for 800-MHz Portable Telephone Used in Cellular Radio Systems", IEEE MTT Vol. 36 No. 6 June 1988. An equivalent circuit for a ladder type impedance element filter is shown in FIG. 1B, where 1, 2 are resonator elements.

A known filter utilises electrically cascade-connected SAW elements of a type known as SAW resonators 120 one type of which is shown schematically in FIG. 1C. The equivalent circuit for a typical ladder structure is shown in FIG. 1D. In the actual structure described in the known filter, SAW resonators having just a large number of electrodes and no reflection gratings were used. In this scheme, the SAW resonators 120 are substantially acoustically independent of each other and are conceptually modelled and used as electrical impedance elements. Modelling and using a SAW resonator 120 as an impedance element is possible because a SAW element such as a SAW resonator 120 has an electrical impedance which is, in part, dependent on the electro-acoustic interaction of the electrode fingers 104 of the SAW resonator 120 with the mechanical vibration of the SAW. Near to the centre frequency of the SAW elements (i.e. the frequency at which the separation of adjacent fingers is $\lambda/2$) the admittance changes strongly and achieves a maximum electrical admittance and a minimum electrical admittance. Clearly, the maximum and minimum electrical admittance are not at the same frequency but near or close to the centre frequency. These are respectively the electrical resonant and anti-resonant frequencies of the SAW element. When large changes in electrical impedance are desired the electroacoustic interaction must be high. Thus, SAW elements with a large number of electrode finger pairs am used. Conventional SAW resonators 120 having reflectors 106 at both ends of a transducer 124 with a large number of electrode pairs can be used, or alternatively transducers having just a large number of finger pairs can be used. Since the SAW resonators 120 in the known filter are being utilised primarily as lumped impedances, it is convenient to term them SAW impedance elements. The term SAW impedance elements will hereinafter be used when referring to any SAW element (IDT, SAW resonator or otherwise) which is being used in at least part for its electrical impedance properties.

In the foregoing the individual SAW resonators 120 can be coupled, as shown in FIG. 1D, as cascade -connected lumped impedance elements and a capacitance C (static capacitance $C_{ST}$) connected in parallel between ground and a port of a SAW resonator 120, In general, impedance element filters have wider passband and lower losses than CRFs, but the area occupied by the filter structures tends to be larger because all the elements are typically situated in different acoustic channels. This does not lend itself to miniaturisation and mitigates against the usefulness of such devices.

BRIEF SUMMARY OF INVENTION

According to the present invention there is provided a surface acoustic wave filter, comprising a first interdigitated transducer having a first resonance frequency and a second interdigitated transducer having a second resonance frequency, an acoustic port of the first interdigitated transducer disposed confronting an acoustic port of the second interdigitated transducer, and wherein a first electric terminal of the first interdigitated transducer is electrically coupled to a first electric terminal of the second interdigitated transducer.

This has an advantage in that respective transducers of a filter can be placed close to each other such that the filter is folded, thereby reducing the area taken up by the filter. Additionally, there is the surprising and unexpected synergistic effect of acoustic integration between the first and second transducers improving the insertion loss of the filter. Particularly, respective acoustic ports may be collinear.

In a preferred embodiment, the first resonance frequency substantially corresponds to an anti-resonance frequency of the second interdigitated transducer. Thus, signals at the resonance frequency of the first transducer are coupled through the first transducer, and inhibited from being coupled through the second transducer, thereby forming a filter.

Preferably, an anti-resonance frequency of the first interdigitated transducer is at a higher frequency than the first resonance frequency and the second resonance frequency is at a lower frequency than the first resonance frequency, thereby creating a passband filter having steep skirts.

Suitably, the first resonance frequency is separated from the second resonance frequency by an amount of the order of the ΔV/V parameter of a substrate supporting the filter. This defines the bandwidth of the filter.

Typically, the first electric terminal of the first interdigitated transducer and first electric terminal of the second interdigitated transducer are electrically coupled via a common busbar, and a second electric terminal of the second interdigital transducer is coupled to ground.

The first and second electric terminal of the first interdigitated transducer respectively form an input or output of the surface acoustic wave filter, which has the advantage that the orientation of respective transducers can be changed such that input and output ports can be chosen to be at coupled electric terminals or independent electric terminals.

The first interdigitated transducer comprises electrodes having a first periodicity for forming the first resonance frequency, and the second interdigitated transducer comprises electrodes having a second periodicity for forming the second resonance frequency, which is a convenient way of determining the resonance frequency of respective transducers. Other methods of varying the resonance frequency may also be used or combined with varying the periodicity of the electrodes.

At least one of the first and second transducers may comprise reflection gratings at an end distal from another transducer. This decreases SAW losses from the ends of the transducers and thereby reduces insertion loss. The transducers may be separated by a spacer, a reflecting grating or acoustic absorber. This permits the amount of acoustic coupling to be varied or even stopped altogether.

The electrodes of the transducers and/or the grating reflectors may be made of high density metal which improves the reflectivity of the electrodes.

Individual filters may be cascaded to form composite filters, some or all of the individual filters can have the second electric terminal of the second interdigitated transducer grounded.

Filters in accordance with the present invention are not limited to utilising surface acoustic waves but may also utilise leaky surface acoustic waves, surface transverse waves, waveguide modes or any other modification of surface and quasisurface acoustic waves.

The filters can be cascaded to form a balanced input/output scheme. This has the advantage that balanced inputs and outputs can be designed, which is particularly useful with balanced mixers in communication devices.

In a composite filter at least one electrode of a transducer or a reflection grating electrically couples busbars disposed on different sides of an acoustic channel. This is a convenient way of coupling busbars together whilst maintaining a compact topographical layout.

The filter works in similar fashion to ladder filters. In the passband frequency range the voltage applied to the input is transferred almost completely to the output because at the resonance of the first transducer the impedance of the first transducer is low and therefore the input is practically coupled directly to the output. However, at this resonance frequency the second transducer has a high impedance and hardly influences the transfer of the signal to the output. A part of the acoustic energy from the first transducer passes to the second transducer reducing the loss of the filter. The filter has smaller size in both transversal (roughly 2 times smaller) and longitudinal direction, because the spacer S between the channels can be made about one SAW wavelength.

A filter in accordance with the present invention combines some features of both CRFs and IEFs. In accordance with an embodiment of the present invention both electrical and acoustical coupling of the transducers are used.

DETAILED DESCRIPTION OF INVENTION

Embodiments of the invention will now be described, by way of example only, and with reference to the accompanying drawings.

Figure 1A:
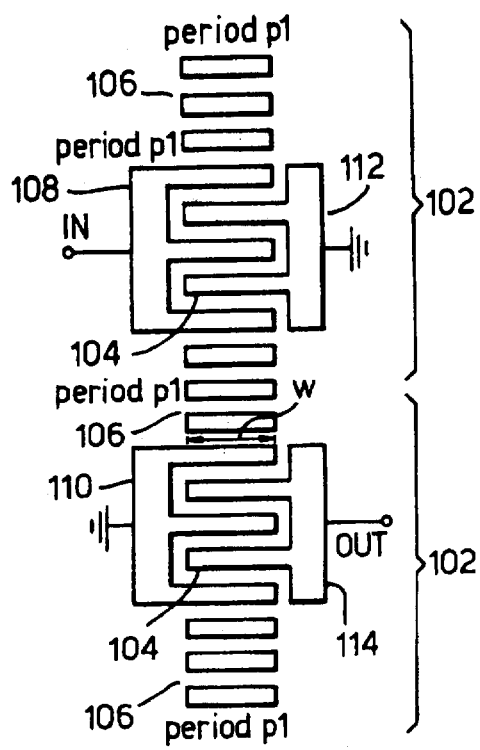
FIGS. 1A and 1B respectively show a conventional coupled resonator filter and ladder type impedance element filter.
Figure 1B:
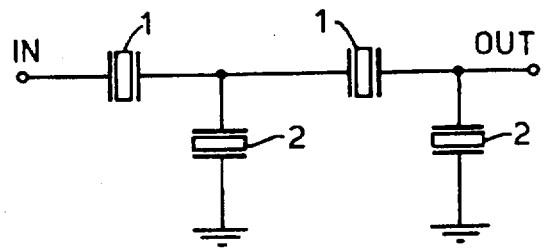
Figure 1C:
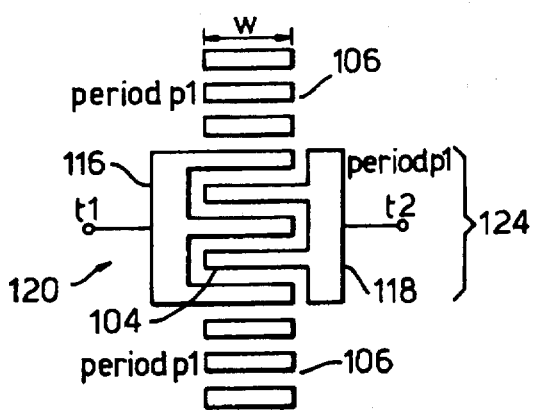
FIG. 1C shows a conventional one port resonator.
Figure 1D:
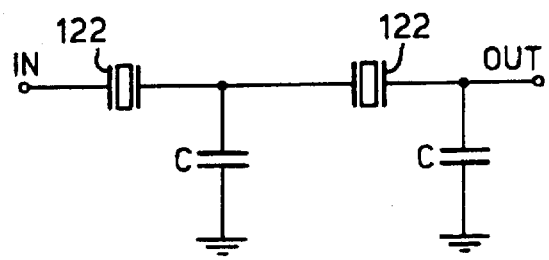
FIG. 1D shows an equivalent circuit for the structure described in "Miniature SAW Antenna Duplexer for 800-MHz Portable Telephone Used in Cellular Radio Systems"
Figure 2A:
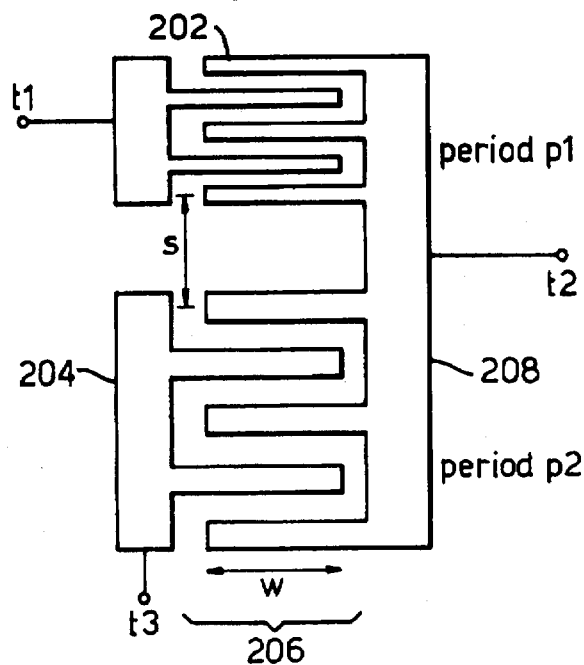
FIGS. 2A and 2B show first and second embodiments in accordance with the present invention.

FIG. 2A shows an embodiment in accordance with the invention comprising two interdigital transducers 202 and 204 situated in the same acoustic channel 206 and interacting acoustically. The apertures of the transducers can be made equal, but not necessarily. The transducers are connected electrically by busbar 208. The first transducer 202 is connected to the first and second terminal of the filter, t1 and t2, the second transducer 204 is connected to the second terminal of the filter t2 and to the third terminal t3, which can be grounded. The first and second transducers 202, 204 have different respective resonance frequencies, $f_{R,s}$ and $f_{R,p}$, which can be achieved for example by using different periods, p1 and p2, of the electrode structures. FIG. 2B shows the same filter but with the input and output interchanged.

Figure 2C:
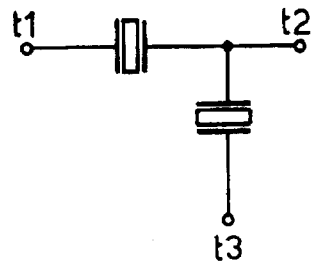
FIGS. 2C and 2D are circuit diagrams of the embodiments shown in FIGS. 2A and 2B.
Figure 2B:
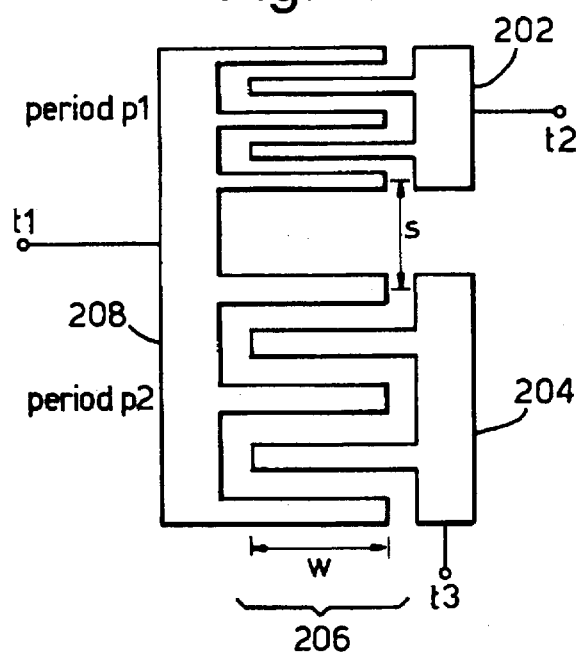
Figure 2D:
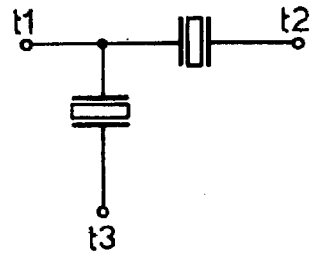
Figure 2E:
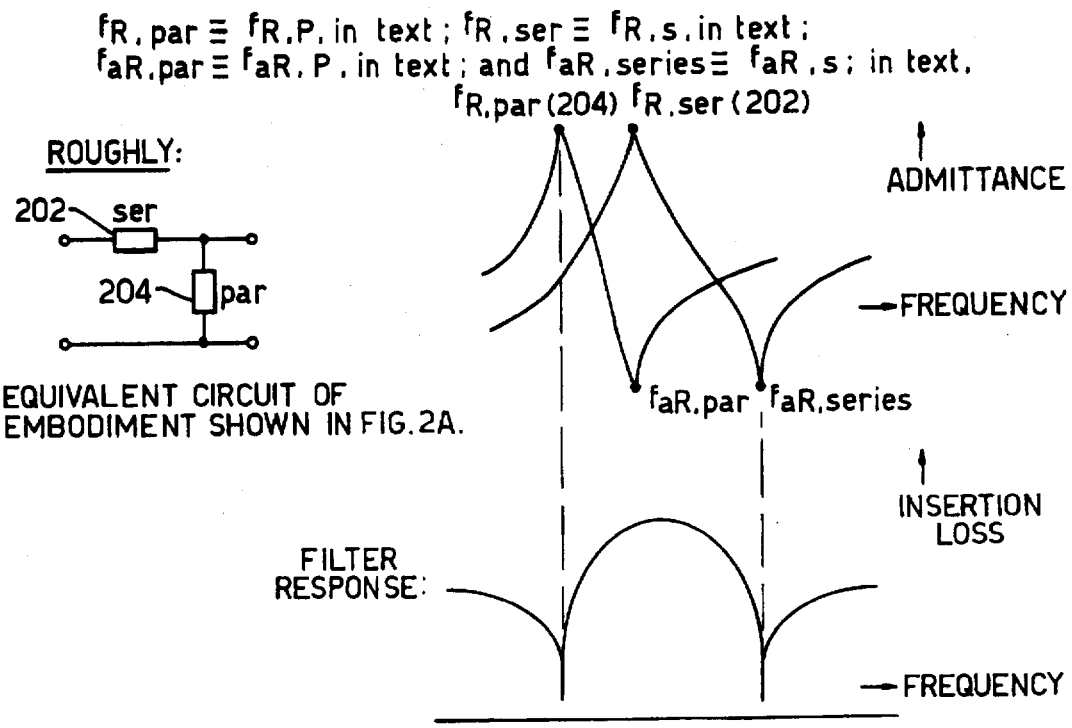
FIG. 2E shows Impedance against Frequency and Insertion loss against Frequency for a device shown in FIG. 2A and 2B.

FIGS. 2C and 2D show the schematic circuit diagram for the filters shown in FIGS. 2A and 2B.

When a source of radio frequency signals is connected to the input of the filter shown in FIG. 2 and a load is connected to the output, surface acoustic waves (SAW) are generated in both transducers 202 and 204. As shown in FIG. 2E, at the resonance frequency $f_{R,s}$ the admittance/impedance of the first transducer 202 is high/low, so that only small part of the voltage applied to the input appears across the terminals of this transducer. The main part of the input voltage is transferred to the load and to the second transducer 204 connected in parallel to the load. The second transducer has an anti-resonance $f_{aR,p}$ at the resonance frequency $f_{R,s}$, such that $f_{aR,p} \approx f_{R,s}$. Thus, the current flow through transducer 204 is very small and the current from the input is substantially wholly coupled into the load. Thus, the main part of the energy of the input signal is transferred to the load, which means low insertion loss in the passband corresponding to the resonance frequency $f_{R,s}$. At higher frequencies the anti-resonance of the first transducer $f_{aR,s}$ 202 occurs and substantially no current passes through the first transducer 202. This creates a notch which limits the right hand side or upper frequency of the passband. The resonance frequency $f_{R,p}$ of the second transducer 204 occurs at a frequency lower than $f_{R,s}$ and creates a left hand side or lower frequency notch on the filter characteristic. In this way passband characteristics are created. In the stopband the input voltage is shared between the static capacitances of the transducers 202, 204 and the output signal is damped to a level determined by the ratio of the static capacitances.

Typically, transducers, particularly in ladder type filters, are situated in different (in most cases parallel) acoustic channels which makes the physical size of the filter large. In accordance with the present invention at least two transducers are placed in the same acoustic channel. This decreases the width of the filter by approximately 2 times. The length of the filter is also decreased due to the placement of two transducers close to one another. In the particular case shown in FIGS. 2A and 2B there is a very small spacing(s) of the order of 1 acoustic wavelength between respective transducers and the electrode structure of one transducer can be continuously prolonged by another.

Figure 13A:
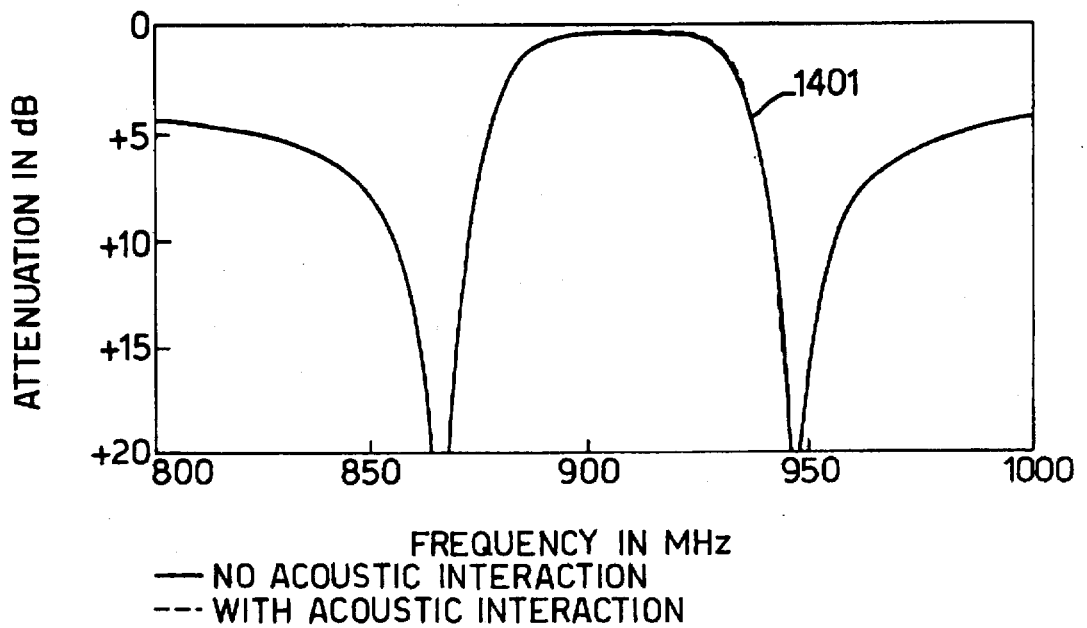
FIGS. 13A and 13B show frequency characteristics of the first embodiment in accordance with the invention shown in FIG. 2A.
Figure 13B:
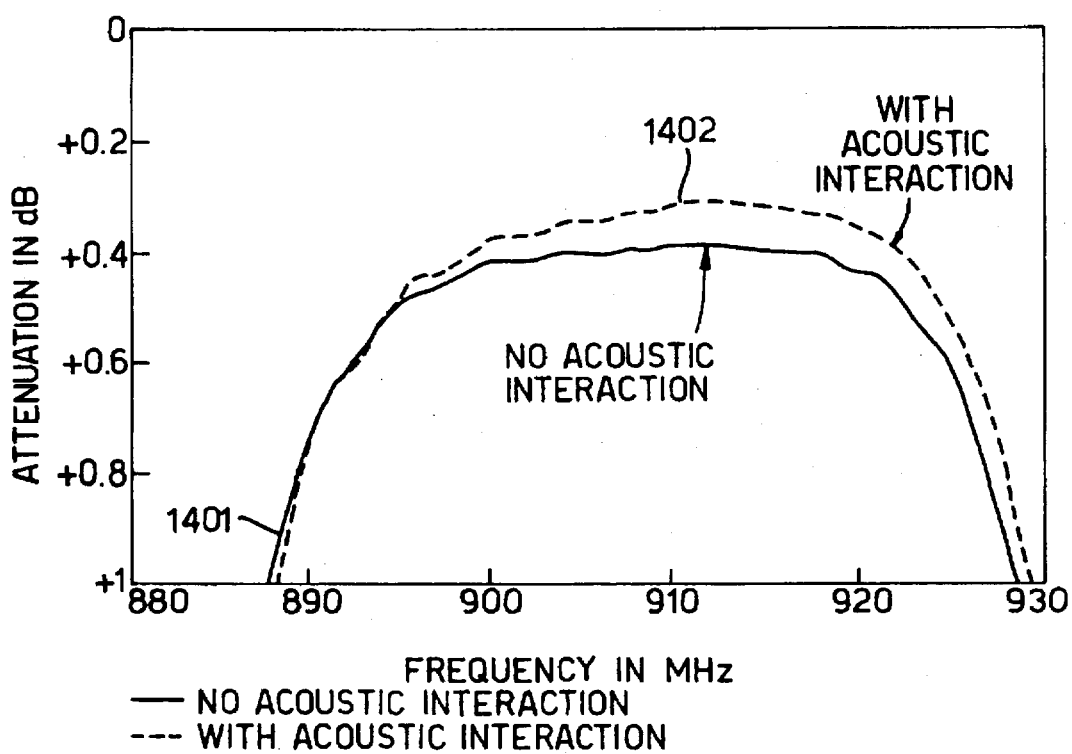

FIGS. 13A, 13B illustrate the performance of a filter as shown in FIG. 2A with and without acoustic interaction between the transducers 202, 204. The filters had a substrate of 64- LiNbO$_3$, with each transducer having 300 electrodes, period p1=2.4 µm, p2=2.52 µm and an aperture of about 10 wavelengths. A filter characteristic for no acoustic interaction is shown by line 1401, and with acoustic interaction by line 1402. From FIG. 13B, which is a detail of FIG. 14B, it can be seen that acoustic interaction has little effect on the performances in the stopband and slightly improves the insertion loss.

Figure 14A:
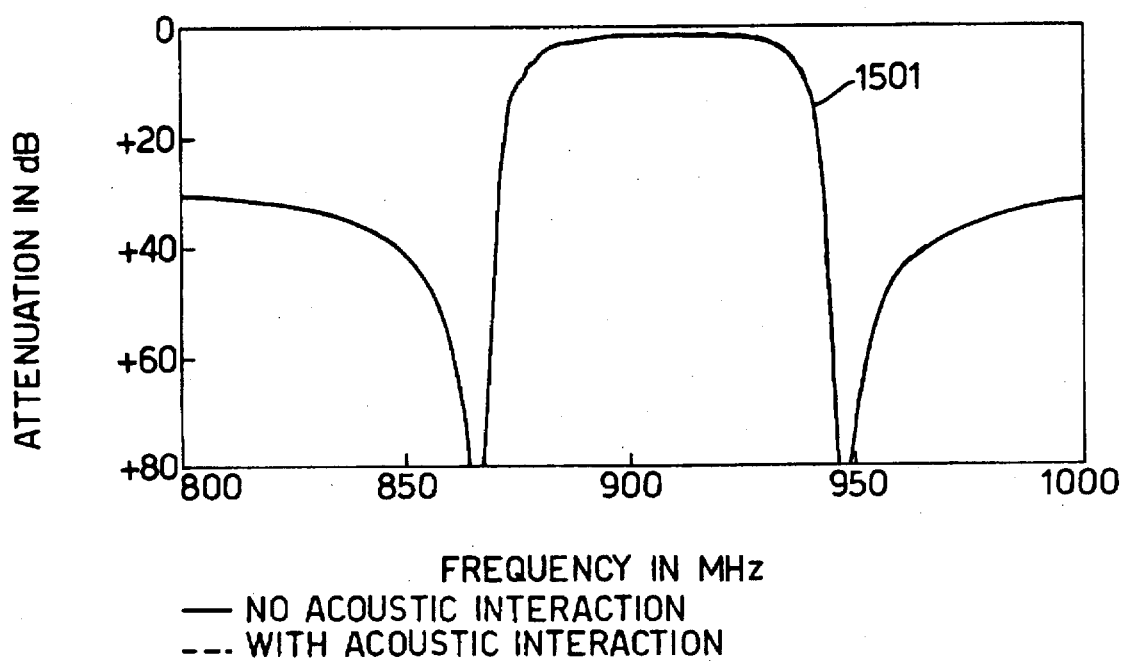
FIG. 14A and 14B frequency characteristics of a filter comprising four sections substantially identical to those used to achieve the results of FIG. 13.
Figure 14B:
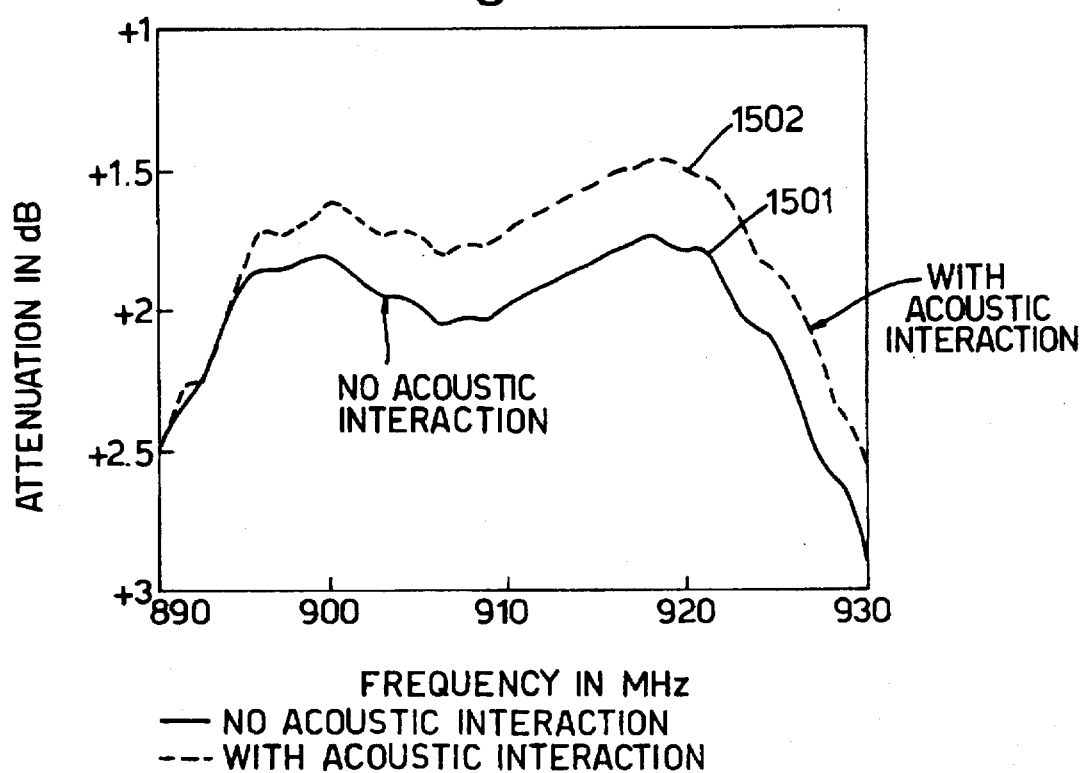

FIGS. 14A, 14B shows the characteristics of a filter including 4 cascaded sections of the same type as discussed above. A filter characteristic for no acoustic interaction is shown by line 1501, and with acoustic interaction by line 1502. The same behaviour is observed, that is the performances are identical in the stopband and are slightly better in the passband (0.2 dB improvement), compared with no acoustic interaction as shown in FIG. 14B which is a detail of FIG. 14A. As before, the dotted line shows the response with acoustic interaction, and the solid line without acoustic interaction.

More complicated structures than those shown in FIG. 2 can be derived, including reflecting gratings, more than two transducers, and larger spacers to improve flexibility of the design of the filter. FIGS. 3 to 6 illustrate some possible designs, but more other possibilities are evident for the persons skilled in the art.

Figure 3A:
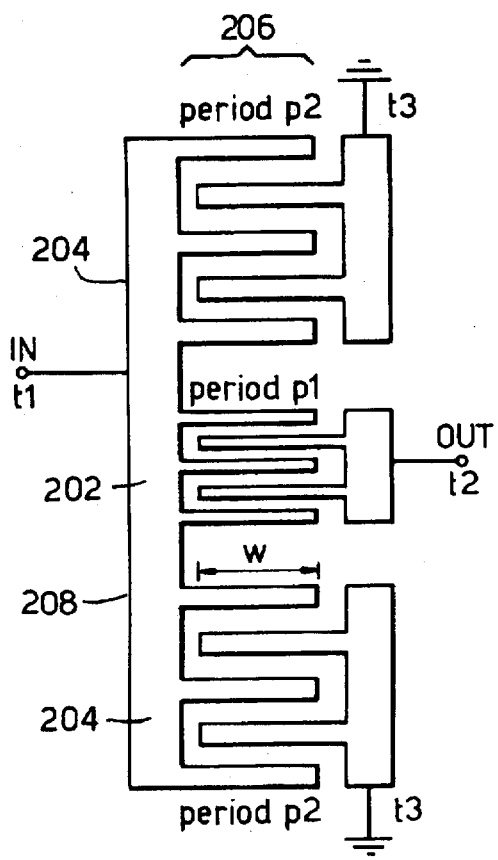
FIG. 3 shows third and fourth embodiments of filters comprising three transducers.
Figure 3B:
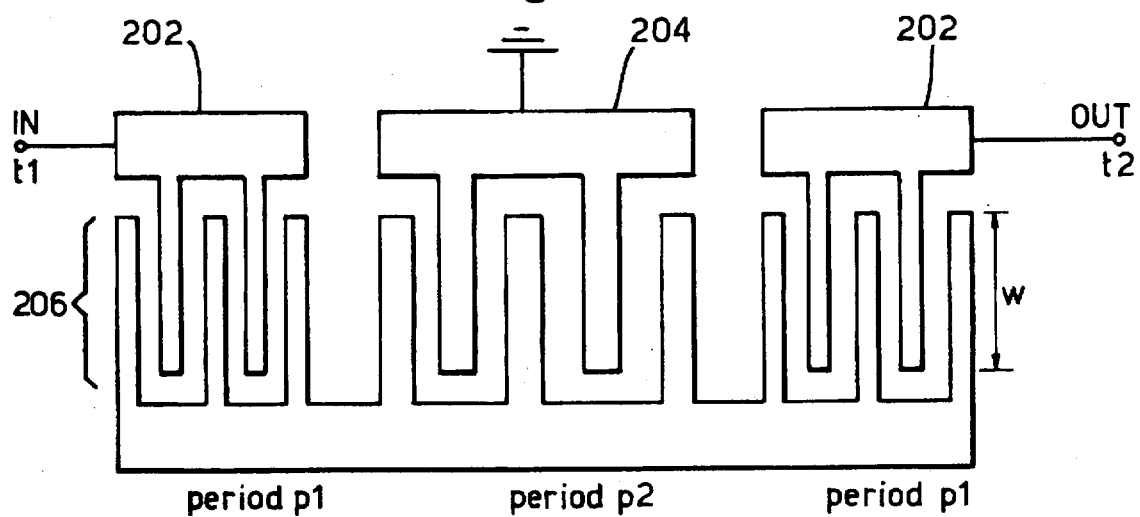
Figure 4:
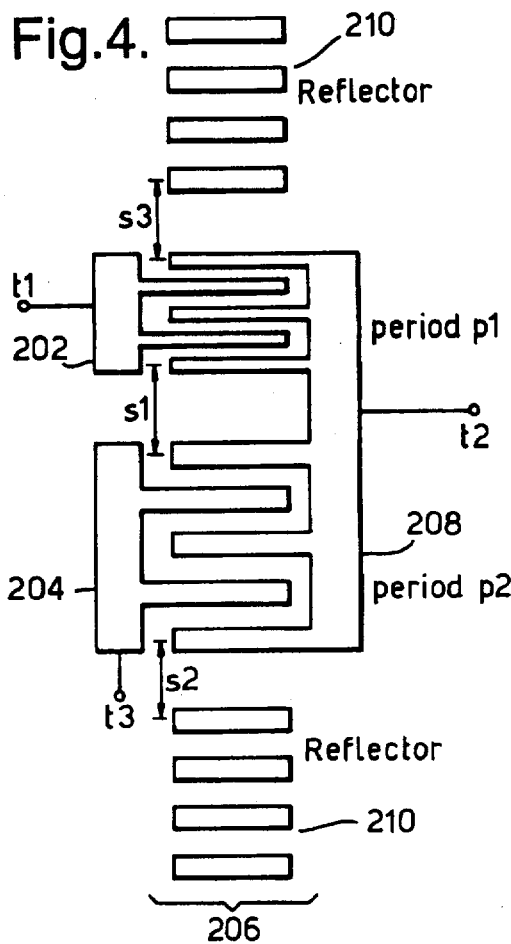
FIG. 4 shows a fifth embodiment similar to the first and second embodiments of FIG. 2 but having additional reflectors at the outer ends of the transducers.
Figure 6:
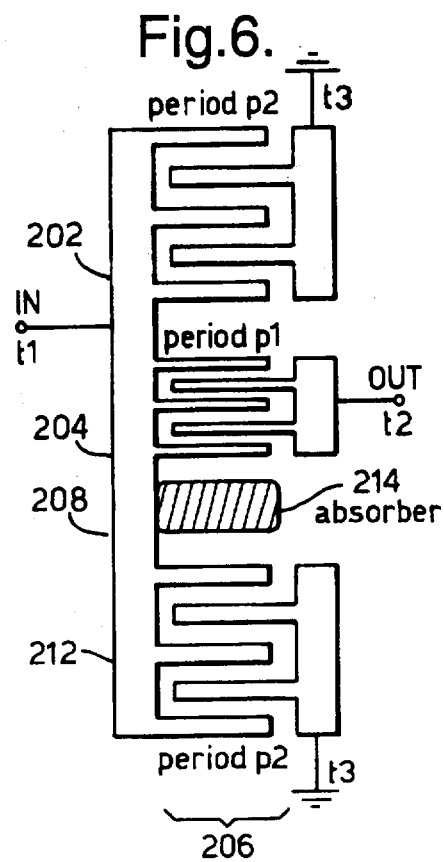
FIG. 6 shows a filter having two transducers separated by an acoustic absorber.
Figure 5:
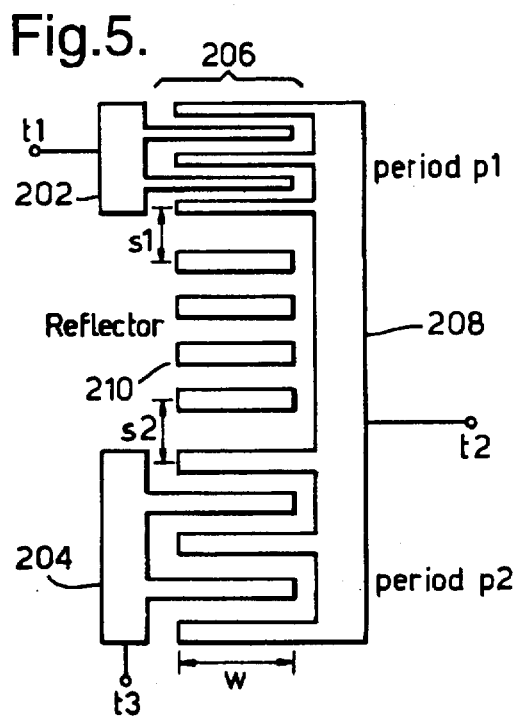
FIG. 5 shows a diagram of a filter having a reflection grating disposed between the transducers.

FIG. 3A shows a first transducer 202, disposed substantially symmetrically between two second transducers 204. The electrical output terminals of the second transducers are grounded. In FIG. 3B, an embodiment which is the converse of FIG. 3A is shown. FIG. 4 shows an embodiment of a filter in which reflection gratings 210 are placed at the outer ends of transducers 202 and 204. The reflection gratings inhibit SAW losses of SAW energy from the ends of transducers 202 and 204, and this the insertion loss of the filter is decreased. In FIG. 5, the central reflection grating 210 acts to inhibit acoustic coupling between the two transducers 202 and 204. The amount by which the acoustic coupling is inhibited can be varied by increasing or decreasing the reflectivity of the grating, e.g. increasing or decreasing the number of electrodes or the reflectivity of individual electrodes of the grating. Thus, the amount of acoustic coupling can be controlled. In FIG. 6, acoustic absorber 214 is placed between two adjacent and collinear transducers 204 and 212 to substantially acoustically isolate them from each other.

Figure 7:
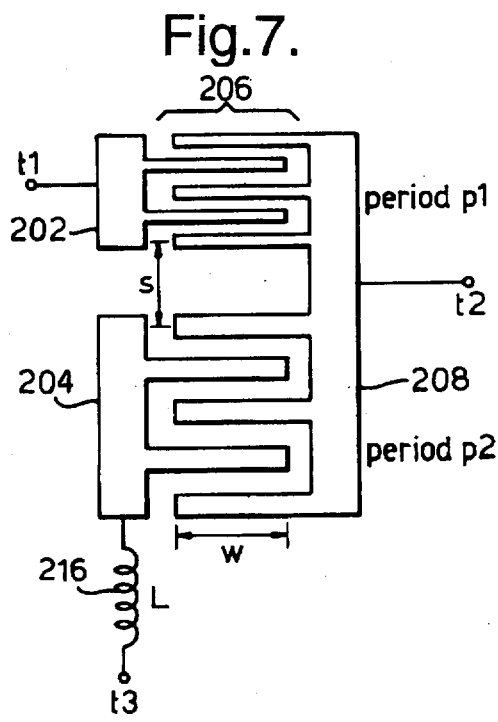
FIG. 7 shows a filter where one of the terminals of a transducer is coupled in series with an inductance.

Typically, SAW filters are connected by wires to the pins of the packages in which they are usually placed and some inductances are introduced in series with the terminals of the filter depending on the length of the bonding wires. These inductances can be helpful as far as the insertion loss and the increase of the passband of the filter are concerned since the serve to assist matching of the filter and a favourable change of the impedance of the impedance elements. FIG. 7 schematically shows the case where the inductance 216 is connected in series with at least one of the terminals of the filter. If the value of the bond wire inductance is not sufficient it can be replaced by a lumped inductance or by an inductance placed on the substrate or on the package. A combination of such inductances can also be used.

Figure 8:
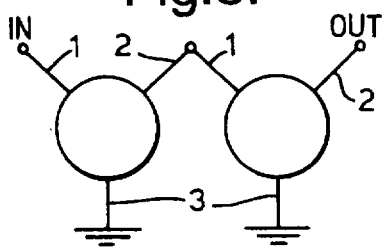
FIG. 8 shows a schematic diagram of cascaded filters.

As has already been mentioned, to achieve acceptable stopband levels of suppression individual filters can be connected in different ways. One way is simply cascading them together with one of the terminals used as a common ground, as schematically shown in FIG. 8. The frequency response of this case of 4 filters cascaded together is illustrated in FIG. 14.

Figure 9B:
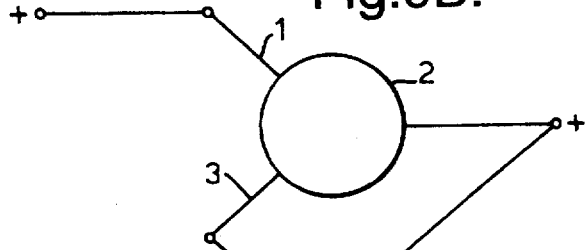
FIG. 9B shows a second embodiment of a balanced network.
Figure 9A:
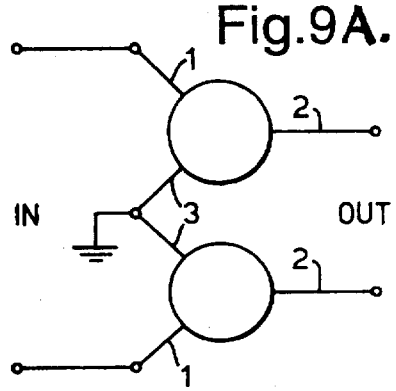
FIG. 9A is a schematic diagram showing an embodiment of a balanced network.
Figure 9A:
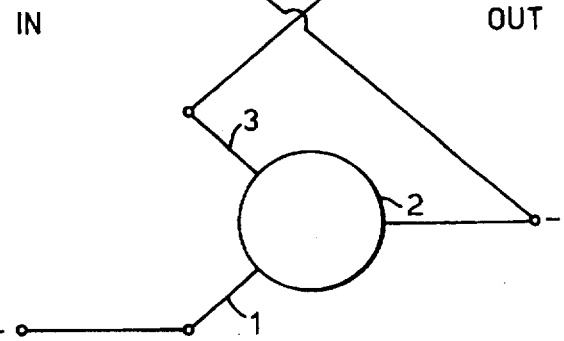

The filters can be cascaded in a different way as illustrated in FIG. 9, such that a network for a balanced input/output is created. Such sections can be also cascaded to get desired characteristics.

Figure 10A:
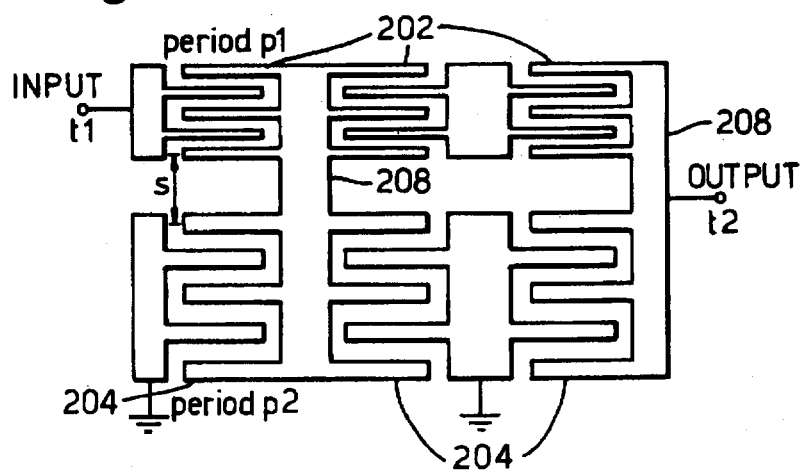
FIG. 10A and 10B show three and four section filters having common busbars for electrically coupling transducers with neighbouring sections.
Figure 10B:
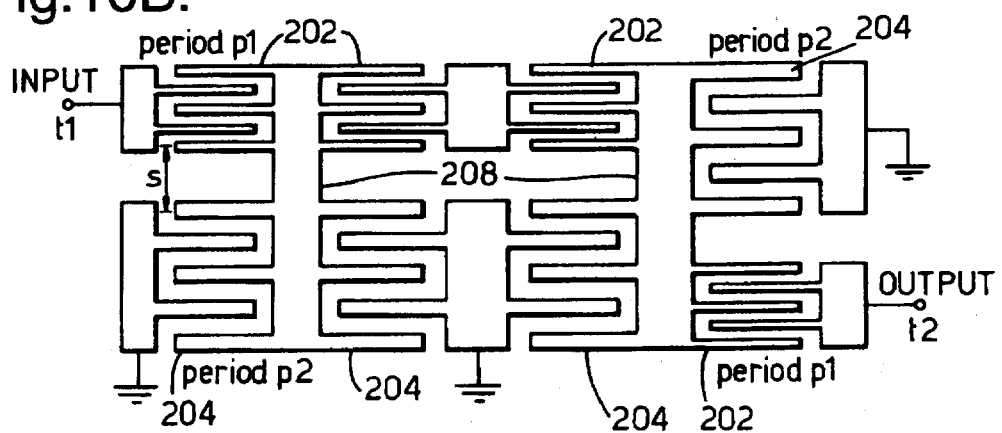
Figure 10C:
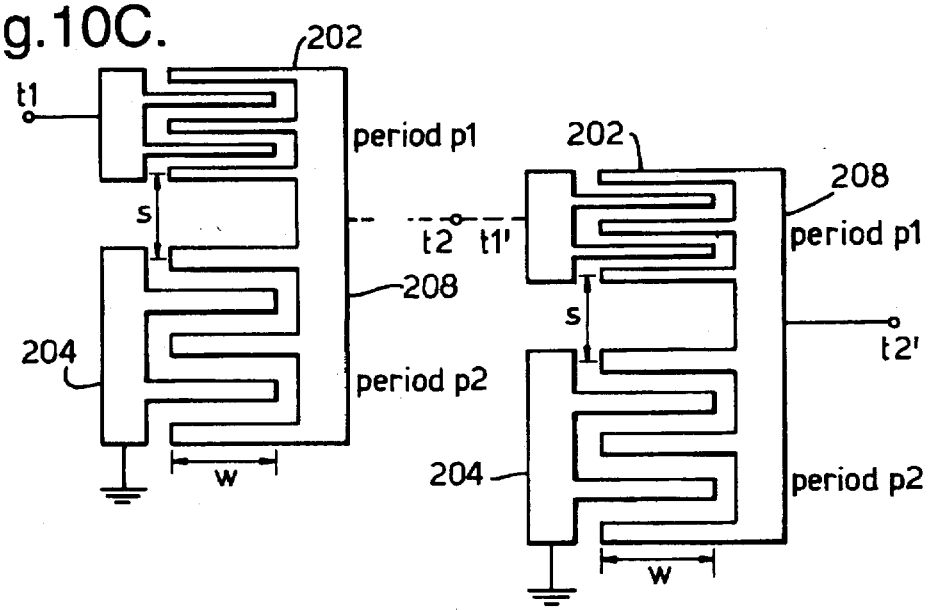
FIG. 10C shows a cascade filter comprising filters as shown in FIG. 2.

Cascading of filters shown in FIGS. 2A and 2B can be done using common busbars between the respective transducers 202, 204. An example of such layout for 3- and 4-section filters is shown schematically in FIG. 10A and 10B. FIG. 10B shows the case where the input and output are disposed asymmetrically to increase the distance between them and to decrease direct electromagnetic feedthrough. FIG. 10C shows simple cascaded filters of the type shown in FIG. 2A.

FIG. 11 shows another embodiment having a compact layout for cascading two filter sections where the electrodes 207 of the transducer 204 are used for the electrical connection of the busbars situated on different sides of the acoustic channel 206. Optionally, a plurality of electrodes or electrodes of reflection gratings can be used to electrically connect busbars on opposite sides of the acoustic channel.

Figure 11A:
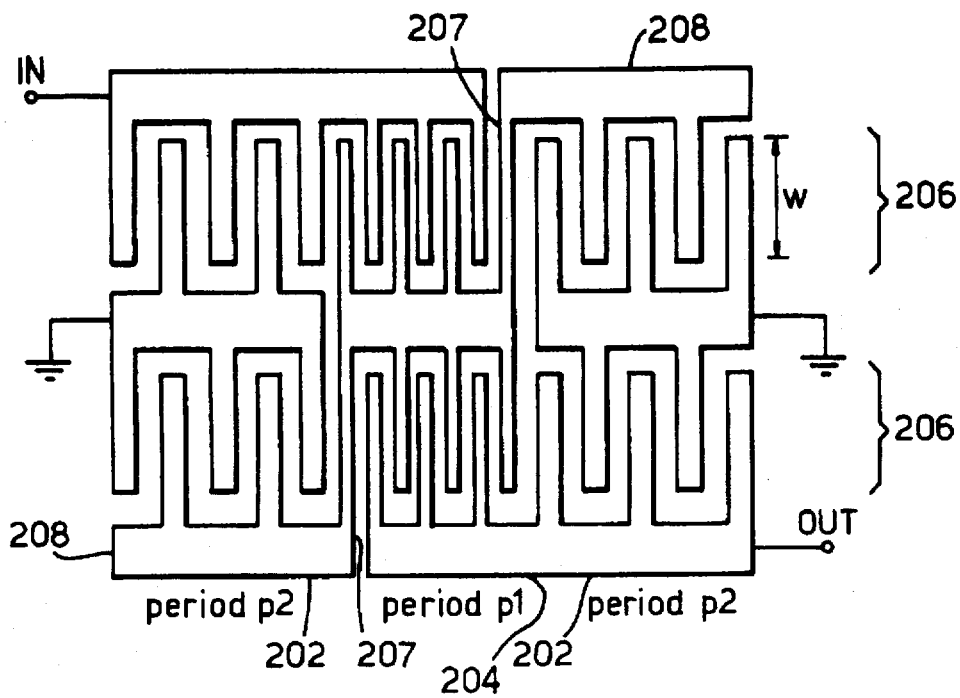
FIG. 11A and 11B show yet a further embodiment in accordance with the present invention.
Figure 11B:
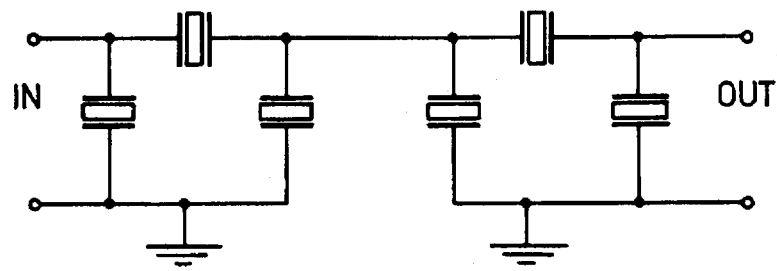

FIG. 11B is an equivalent lumped element circuit corresponding to the embodiment shown in FIG. 11A.

Figure 12:
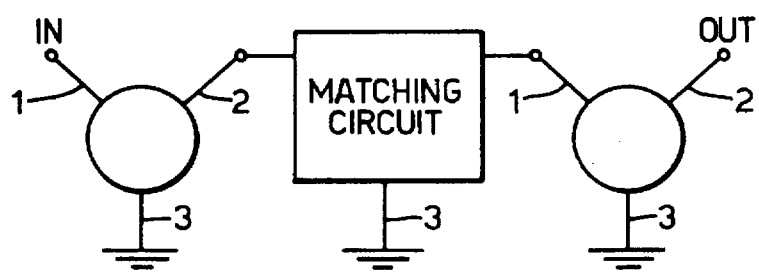
FIG. 12 shows a two-section filter having a matching circuit between respective sections.

In most cases the filter needs no matching. However, in some cases matching can be used to increase the passband of the filter and/or reduce loss. The passband of the filter is substantially determined by the $\Delta V/V$ parameter of the substrate and is limited, especially for weak piezoelectric material like quartz. The introduction of series or parallel inductances (or generally speaking matching circuits) between the cascaded sections and/or input/output of the filter can be useful in such cases to increase the bandwidth of the passband of the filter. Such an embodiment is shown in FIG. 12.

In view of the foregoing description it will be evident to a person skilled in the art that various modifications may be made within the scope of the invention. For example, the acoustic ports do not have to be in line but may be offset.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or any such further application derived therefrom.

What we claim is:

1. A ladder surface acoustic wave filter, comprising a piezoelectric substrate, a first interdigitated transducer disposed on said substrate having a first resonance frequency and a second interdigitated transducer disposed on said substrate having a second resonance frequency, an acoustic port of the first interdigitated transducer disposed in an acoustic channel confronting an acoustic port of the second interdigitated transducer in the same acoustic channel as said first interdigitated with acoustic interaction between said confronting acoustic ports and wherein a first electric terminal of the first interdigitated transducer is electrically coupled to a first electric terminal of the second interdigitated transducer.

2. A ladder surface acoustic wave filter according to claim 1, wherein the acoustic port of the first interdigitated transducer is substantially collinear with the acoustic port of the second interdigitated transducer.

3. A ladder surface acoustic wave filter according to claim 1, wherein the first resonance frequency substantially corresponds to an anti-resonance frequency of the second interdigitated transducer.

4. A ladder surface acoustic wave filter according to claim 3, wherein an anti-resonance frequency of the first interdigitated transducer is at a higher frequency than the first resonance frequency and the second resonance frequency is at a lower frequency than the first resonance frequency.

5. A ladder surface acoustic wave filter according to claim 1, wherein said piezoelectric substrate includes a $\Delta V/V$ parameter and wherein the first resonance frequency is separated from the second resonance frequency by an amount of the order of the $\Delta V/v$ parameter of said substrate supporting the filter.

6. A ladder surface acoustic wave filter according to claim 1, wherein the first electric terminal of the first interdigitated transducer and the first electric terminal of the second interdigitated transducer are electrically coupled via a common busbar.

7. A ladder surface acoustic wave filter according to claim 1, wherein the first and a second electric terminal of the first interdigitated transducer respectively form an input or output of the surface acoustic wave filter.

8. A ladder surface acoustic wave filter according to claim 1, wherein a second electric terminal of the second interdigital transducer is coupled to ground.

9. A ladder surface acoustic wave filter according to claim 1, wherein the first interdigitated transducer comprises electrodes having a first periodicity for forming the first resonance frequency, and the second interdigitated transducer comprises electrodes having a second periodicity for forming the second resonance frequency.

10. A ladder surface acoustic wave filter according to claim 1, wherein at least one of the first and second transducers comprises a reflection grating at an end distal from another transducer.

11. A ladder surface acoustic wave filter according to claim 1, wherein first and second transducers are separated by a reflecting grating.

12. A ladder surface acoustic wave filter according to claim 1, wherein the first and second transducers are separated by a reflecting grating.

13. A ladder surface acoustic wave filter according to claim 1, wherein the first and second transducers are separated by an acoustic absorber.

14. A ladder surface acoustic wave filter according to claim 1, wherein the electrodes of the transducers and/or reflectors are made of high density metal.

15. A ladder acoustic wave filter according to claim 1, wherein the common busbar is of a different thickness metal than the electrodes of the transducers.

16. A ladder surface acoustic wave filter according to claim 1, wherein at least one of the electric terminals of the transducers is coupled in series with an inductance.

17. A ladder filter comprising series cascaded filters according to claim 1, with the second electric terminal of the second interdigitated transducer grounded.

18. A ladder surface acoustic wave filter according to claim 1, utilizing leaky surface acoustic waves, surface transverse waves, waveguide modes or any other modification of surface and quasisurface acoustic waves.

19. A ladder filter comprising two coupled surface acoustic wave filters according to claim 1, to form balanced inputs and outputs.

20. A ladder filter according to claim 17 or 19, wherein at least one electrode of a transducer or a reflection grating electrically couples busbars disposed on different sides of an acoustic channel.

* * * * *